United States Patent [19]

Cook et al.

[11] 4,123,798
[45] Oct. 31, 1978

[54] HIGH DENSITY BEAM-ACCESSED MEMORY WITH REFERENCE TARGET

[75] Inventors: Francis J. Cook, Topsfield; Frederick E. Kline, Melrose, both of Mass.

[73] Assignee: Avco Everett Research Laboratory, Inc., Everett, Mass.

[21] Appl. No.: 857,314

[22] Filed: Dec. 5, 1977

[51] Int. Cl.² .................... G11C 8/00; G11C 11/23
[52] U.S. Cl. .................................... 365/237; 365/217
[58] Field of Search ................ 365/118, 128, 217, 237

[56] References Cited

U.S. PATENT DOCUMENTS

| | | | |
|---|---|---|---|
| 3,102,998 | 9/1963 | Staehler | 365/128 |
| 3,774,168 | 11/1973 | Koo et al. | 365/237 |

*Primary Examiner*—Stuart N. Hecker
*Attorney, Agent, or Firm*—Melvin E. Frederick

[57] ABSTRACT

This invention relates to apparatus and methods for providing a high-density memory for electrical data and more particularly, to such a memory wherein data are represented by patterns of charge written and read by electron beam means at addressed locations.

26 Claims, 4 Drawing Figures

HIGH DENSITY BEAM-ACCESSED MEMORY WITH REFERENCE TARGET

BACKGROUND OF THE INVENTION

During more than two decades of development of electron-beam-accessed stored-charge memory devices, successively more satisfactory solutions to four major initial problems of such devices have been devised. These problems were, first, limited life of the cathodes of the electron beam sources; second, rapid fading of data charge patterns in the absence of refresh; third, difficulty of precisely accessing a given addressed location on the storage target; and fourth, limited packing density of data on that target.

To date, oxide cathodes for electron beam sources have been largely superseded by much longer-lived varieties such as dispenser and lanthanum hexaboride types. The cathode life problem is thus reasonably well solved, and can be completely solved when cold cathodes, such as the field emission or negative-electron-affinity types, are perfected. Rapid fading of data charge patterns has been cured by the development of superior insulating materials such as amorphous silicon dioxide, deposited by pyrolysis or grown by oxidation of a silicon target substrate.

The other two initial problems are still believed to require better solutions; also, existing solutions to each of them seem to exacerbate the other. While it is certainly possible simply to stabilize the mechanical and electrical parameters of an electron-beam-accessed device in open-loop fashion sufficiently to be able to re-access a given data location with any required precision, the resulting bulk and expense of the device and its auxiliaries become impractically great when the requisite precision is high and data packing density is great, such as, for example, substantially more than 100 data locations per storage target width. For this reason, schemes for interleaving location information elements with the data storage elements in data storage targets have been devised. The location elements, when accessed by the electron beam, yield location information which can be used in closed-loop fashion to correct and guide the beam deflection, thus permitting precise and reliable data access in spite of drift in equipment parameters. Typical examples of such prior art schemes are shown in U.S. Pat. Nos. 3,624,633 and 3,789,372 to which reference is made and incorporated herein as if set out at length.

Such interleaving of location information elements with data storage elements, however, considerably reduces the net data packing density of the target, and also adds to its complexity and cost, for a given data capacity. Moreover, since location information elements typically are fabricated as discrete features they are not fully compatible with smooth-layer targets such as the metal-oxide-junction structure described by William C. Hughes et al. in their paper "A Semiconductor Nonvolatile Electron Beam Accessed Mass Memory" in *Proceedings of the IEEE*, Vol. 63, No. 8, August 1975, pages 1230–1240 to which reference is made and incorporated herein as if set out at length. Since such smooth-layer targets can provide data packing density superior to that of targets with discrete fabricated areas, it is clear that such closed-loop beam guidance schemes are not fully compatible with great data packing density.

To avoid the limitation noted immediately above, another stratagem has been devised — relaxing the requirements upon electrical and mechanical precision for open-loop data access by dividing the beam deflection process into two steps, first coarsely directing and focusing a beam upon one of a matrix of smaller focus-deflection elements, and then performing fine-scale deflection and sharp focus in the selected element. This is the so-called "matrix" or "fly's eye" lens system, described in the aforementioned Hughes et al paper and in U.S. Pat. No. 3,491,236. While this stratagem can yield precise access, the requirements upon the accuracy of the large number of matrix lens components, and their mechanical rigidity with respect to each other and their associated target surfaces, result in an undesirably expensive structure.

SUMMARY OF THE INVENTION

It is therefore an object of this invention to provide a simple electron-beam-accessed stored-charge memory device having high information storage density.

It is a further object of this invention to provide such a device wherein data access is precise and reliable.

Another object of this invention is to provide a method for combining precise and reliable data access with high information storage density.

In accordance with the present invention, a plurality of beam-target modules, each module comprising an electron beam source projecting an electron beam upon a facing target surface, is arrayed in parallel in a common beam deflection field. Varying the beam deflection field causes the electron beams to scan over their respective target surfaces in unison. One of the target surfaces bears location information which may be utilized in closed-loop fashion to guide its reference electron beam precisely to specified locations thereon, simultaneously precisely guiding the other electron beams in unison to the corresponding locations on their respective target surfaces, which bear the data to be accessed.

Arraying the modules in a common deflection field assures that disturbances of beam direction, whether due to drift or error in currents producing the field or to apparatus distortion or to external disturbances, are equivalent for all beams and can therefore be cancelled by closed-loop or other suitable readjustment of the deflection field to place the reference electron beam upon the specified locations on its target surface.

One reference target surface bearing location information suffices for guiding precise access to data locations upon a considerable number of neighboring data storage target surfaces; therefore only a small fraction of total target surface is required for the guidance function. Moreover, the data storage target surfaces may be of the smooth-layer type, with concomitant low cost and high data packing density.

The novel features that are considered characteristic of the invention are set forth in the appended claims; the invention itself, however, both as to its organization and method of operation, together with additional objects and advantages thereof, will best be understood from the following description of a specific embodiment when read in conjunction with the accompanying drawings, in which:

DESCRIPTION OF THE PREFERRED EMBODIMENTS

Figure 1:
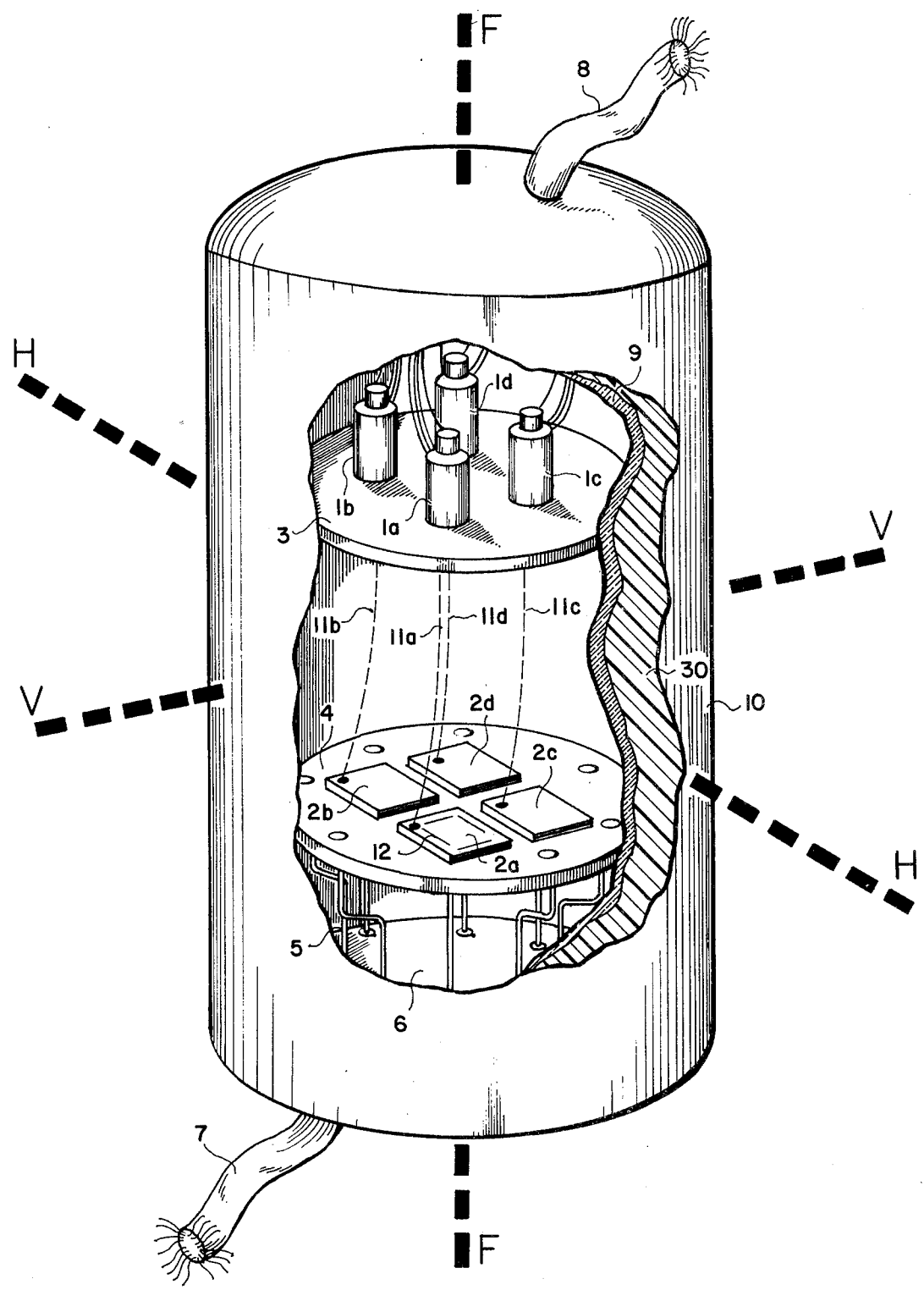
FIG. 1 is a partially broken away perspective view of one embodiment of the invention, simplified to aid in comprehension.

Referring to FIG. 1, there is illustrated an array of beam-target modules, here shown only by way of example as four in number, each comprising an electron beam source or gun 1a–d and a facing target surface 2a–d. The guns 1a–d are supported by support disk 3, and the target surfaces 2a–d are supported by support disk 4, which in turn may be partially supported by and is connected to leads 5 which pass through insulated vacuum header 6 and are connected to cable 7. Cable 7 provides electrical connections to disk 4 and thus, by further connections (not shown) between disk 4 and targets 2a–d, provides connections to the electrical terminals of targets 2a–d.

Electron guns 1a–d and their support disk 3 are partially supported by and connected to another insulated header (not shown) similar to header 6, and the electrical terminals of guns 1 are provided with connection through cable 8. The array of beam-target modules and their supports are enclosed in an evacuated envelope 9, here shown partially broken away to reveal its contents.

Envelope 9 is enclosed in magnetic focus-deflection module 10, also shown partially broken away. In order not to obscure internal details, the windings of the magnetic coils, located in region 30, have been omitted, but are symbolized by dashed lines parallel to their magnetic field directions: F — F represents an axial focus field parallel to the mean beam direction, while H — H and V — V represent, respectively, the "horizontal" and "vertical" deflection fields.

Electron guns 1a–d project electron beams 11a–d upon their respective facing target surfaces 2a–d and these beams are deflected in unison to corresponding locations on their target surfaces by the deflection fields produced by focus-deflection module 10 surrounding evacuated envelope 9. One of the beam-target modules, a reference beam target module, is equipped with a target surface 2a bearing location information which may, for example, be fiducial marks or boundary lines which comprise electron-beam sensitive reference points inscribed on that target surface and indicated in FIG. 1 and FIG. 2 by the numeral 12.

Figure 2:
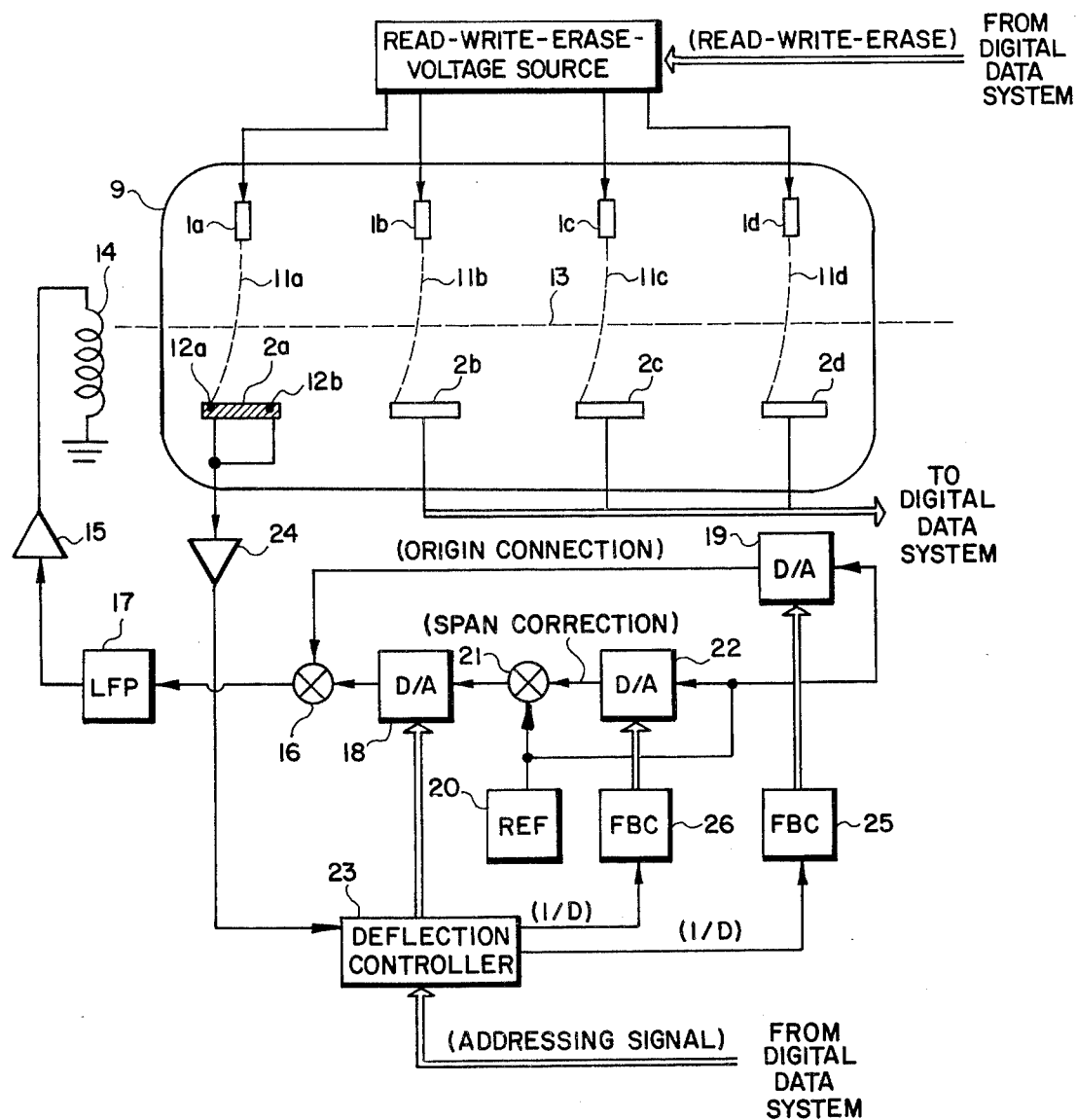
FIG. 2 is a simplified schematic diagram illustrating one procedure for precise location of electron beams upon their target surfaces.

It is to be understood that the beam-target modules used for data storage and retrieval are coupled in conventional manner to a parallel data bus of an associated digital or analog data system utilizing electrical data through suitable conventional amplifiers and gates, and that electron gun and module potentials and currents are controlled in conventional manner to accomplish writing, reading and erasing of data, all substantially in ways familiar to those skilled in the art. Thus, such may be accomplished, for example as shown in FIG. 2, by varying the potential and current of the electron beam or, alternately, varying the potentials upon or within the targets (not shown). For a further discussion of this variation of potentials upon or within the targets, reference is made to the aforementioned Hughes et al paper.

Referring again to FIG. 2, a simplified schematic diagram wherein elements similar to those in FIG. 1 are represented by the same numerals, there is illustrated by way of example apparatus whereby a reference electron beam may, in accordance with the invention, be scanned over a reference target surface by a deflection field in such a way that the scan pattern is precisely aligned on that target surface with respect to both origin and span, and whereby the deflection field scans the other electron beams in unison over their target surfaces in precisely the same manner. FIG. 2 illustrates beam alignment in only one direction (parallel to the surface of the paper); the same apparatus and procedure may be utilized for alignment in a second direction, at right angles to the first (normal to the surface of the paper). Beam alignment in both directions permits precise access to data locations.

In this embodiment of the invention, beam alignment is attained through one or more repetitions of a scanning procedure, hereinafter referred to as an alignment cycle, which may be interspersed with one or more data access procedures, hereinafter referred to as data access cycles. During data access cycles, all beams are deflected to precise locations upon their targets, in each of two directions, in accordance with the numerical significance of two corresponding portions, preferably halves, of the digitally-encoded address numbers denoting the data to be accessed and supplied as addressing signals by the associated data system. To assure such precision of location, beam deflection parameters are adjusted, during the interspersed alignment cycles, so that the reference electron beam falls precisely upon a suitable plurality of fixed locations inscribed upon the reference target surface in accordance with corresponding and, hence, predetermined address numbers. In the embodiment shown in FIG. 2, beam alignment in each direction is attained by adjusting the deflection of the reference beam so that it encounters two fiducial marks inscribed on the reference target at predetermined values of the corresponding portion of the address number. This adjustment is accomplished by closed-loop correction of the origin or mean position and the variation or span of the beam deflection.

Electron beams 11a–d may be deflected in unison in the one direction shown by deflection field magnetic component 13 produced for example by a deflection current through a deflection coil 14 which is part of deflection module 10. The deflection current to coil 14 may be provided by a conventional amplifier 15 in conformity with an analog deflection signal received from a summing point 16 and smoothed by a low-pass filter 17. The input to summing point 16 has two major components — the main deflection signal from a digital-to-analog converter 18 and an origin correction or offset signal from a digital-to-analog converter 19. The full-scale output, or span, of converter 19 is derived from a precise level provided by a stable reference 20, while the span of converter 18 is received from a summing point 21, the inputs to which are the precise level from reference 20 and a span correction signal from a digital-to-analog converter 22, which in turn derives its full-scale output, or span, from the precise level from reference 20.

When deflection controller 23 commands one of a sequence of alignment sweeps in one direction as, for example, by generating a first digital number sequence which spans a set of values of the addressing signal and which is supplied as input to converter 18, the resulting sweep of deflection field component 13 moves the beams 11a–d in unison in the aforementioned one direction, so that the reference electron beam encounters first one, then the other, of two fiducial marks designated by the numbers 12a-b. The resulting reference target signals are boosted by amplifier 24 and supplied as pulses to deflection controller 23. If the first reference target signal pulse occurs later in the digital sequence than had been predetermined, a control output signal comprising an increment command is given by controller 23 to forward-backward counter 25, incrementing the digital number input to converter 19, and thus incrementing the analog origin correction signal which is a further control output signal to summing point 16; the converse time sequence yields a control output signal comprising a decrement command to counter 25, thus decrementing the signal to summing point 16. In either case, in one or more repetitions of the above-described procedure, the deflection field component 13 is adjusted in mean value so that the reference electron beam encounters the first fiducial mark at precisely the predetermined location in the commanded digital sequence. The foregoing process is simply described, in the terminology of digital devices, by stating that the algebraic sign, of the difference of values of the actual and predetermined addresses at which the beam encounters the first fiducial mark, is used as an increment-decrement signal to a counter whose content is additively combined with the deflection signal.

In a similar manner, the time of occurrence of the second reference target signal pulse is compared with its predetermined location in the digital sequence or, in equivalent terms, the interval between the first and second reference target signals is compared to the predetermined interval in the digital sequence. If the second reference target signal pulse occurs later in the digital sequence than had been predetermined, a control output signal comprising an increment command is given by controller 23 to forward-backward counter 26, incrementing the digital number input to converter 22, and thus incrementing the analog span correction signal which is a still further control output signal to summing point 21, and the full-scale output, or span, of converter 18. The converse time sequence yields a decrement command to counter 26, thus decrementing the span of converter 18. In either case, after one or more repetitions of the above-described procedure, the deflection field component 13 is adjusted in variation, or span, so that the reference electron beam encounters the second fiducial mark at precisely its predetermined location in the commanded digital sequence. In the terminology of digital devices, this process can be described by stating that the algebraic sign of another or second difference of values of the actual and predetermined addresses at which the beam encounters the second fiducial mark, is used as an increment-decrement signal to another counter, whose content is multiplicatively combined with the deflection signal.

As will be apparent to those skilled in the art, there can be numerous functionally equivalent variants of the just-described sequence of operations. For example, the origin correction could be derived from the beam encounter with the second fiducial mark rather than with the first, and the span correction could be derived from the beam encounter with the first fiducial mark rather than with the second; this latter operation requiring inversion of the increment-decrement connection. Alternatively, simple digital arithmetic could be performed upon the numbers in the digital sequence at which the fiducial marks are encountered; the sum of those numbers, compared to their predetermined sum, could be used for origin correction, while their difference, compared to their predetermined difference, could be used for span corrections. Different combinations of these and similar operations will yield functionally equivalent sequences of operations for determining the position of the reference beam in one direction.

As the result of both the origin and span corrections, the reference beam encounters both fiducial marks 12a-b at precisely their predetermined locations in the commanded digital sequence, and thus the position in one direction of the reference electron beam upon its target structure is uniquely and precisely determined for each number in the sequence, with due allowance for circuit delays. Since all of the electron beams 11b-d share the same deflection field component 13, they are deflected in unison with the reference electron beam 11a and their positions in one direction upon their targets are similarly uniquely and precisely determined for each number in the digital sequence.

The same sequence of operations, repeated in the other direction by a second set of apparatus identical to that shown in FIG. 2, but sharing controller 23 and in conformity with a second digital number sequence, uniquely and precisely determines the position of the reference beam 11a, and consequently that of the other beams 11b-d, in that other direction, for each number in the second digital sequence. The numbers of the two aforementioned digital number sequences may be related in a one-to-one sense with portions, preferably halves, of the address codes of the data to be accessed. Therefore, later application of those portions of the address codes as addressing signals to the inputs of the converters 18, holding fixed the content of counters 25 and 26, will cause each of the beams to be precisely positioned in both directions to access its target location pertaining to that address.

The previously described procedure is effective to align all beams so that precise data access can be accomplished. To cancel out any drift and time-varying distortion, it is desirable to repeat the alignment procedure frequently, especially during startup and at other times when equipment parameters are changing. Therefore, alignment cycles can be interleaved with data access cycles. In the simplest but slowest case, each data access operation may begin with an alignment cycle, with further provision to initiate additional alignment cycles if no data access commands are received during some interval.

Figure 3:
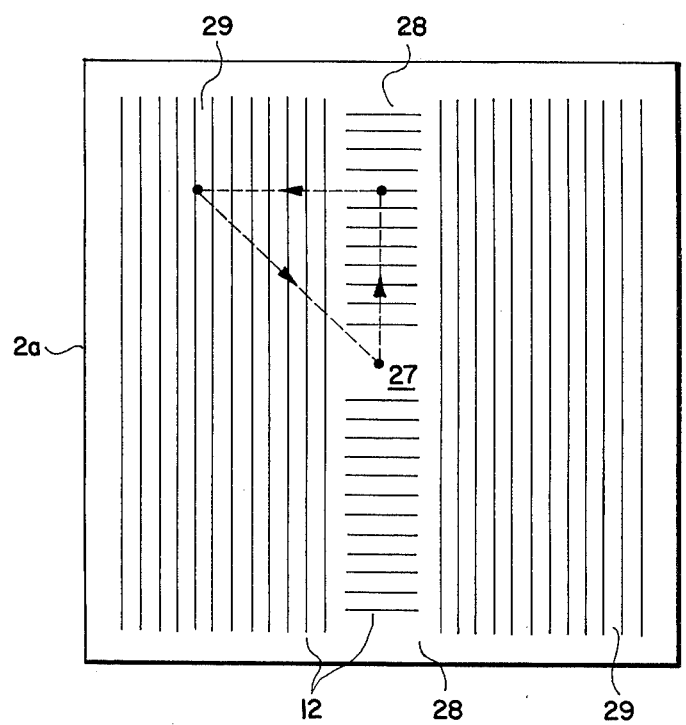
FIG. 3 is an illustration of a pattern of target fiducial marks for use in an alternate procedure for precise location of electron beams.

A savings of time required to establish and maintain reference beam alignment may be attained by an alternate and essentially discrete procedure by which the reference electron beam can be guided to precise locations on its reference target surface. This procedure is described with reference to FIG. 3, which illustrates a pattern of fiducial marks inscribed as manifolds of lines on a reference target surface for use with this alternate procedure. In FIG. 3, elements similar to those in other figures are represented by the same numerals.

In the initial or quiescent state of the memory device, the reference electron beam may fall in blank area 27, which is of a size to accommodate any normal misalignment of the reference beam. In the particular embodiment illustrated in FIG. 3, blank area 27 is located in the center of the reference target surface, and the remainder of the surface bears fiducial marks 12 which are arrayed in a symmetric pattern having four similar quadrants. As in the embodiment described with reference to FIG. 2, the reference beam, and simultaneously all the other beams, are deflected in unison in each of two directions, by deflection field components generated in conformity with two digital number sequences, having values within those of the addressing signals, provided by a deflection controller in accordance with the addressing signal carrying the digital address of the data to be accessed.

In accordance with one bit of a first portion, such as a half, of the aforementioned address, the first digital number sequence is monotonically either incremented or decremented, causing the reference beam to scan a "vertical" path up or down across a first manifold 28 of fiducial marks inscribed, for example, as a narrow ladder on the reference target, giving rise to a pulse output signal as each fiducial mark is encountered. The number of such pulse output signals is continously compared with the numerical significance of the remainder of that first portion of the address, the difference of values being a control output signal. The algebraic sign of this difference may be used as a binary control signal, since it changes when a match occurs with that first portion of the address. This binary control signal, converted to a binary switching signal, may be applied to a gate to interrupt the first digital number sequence, thus holding constant the "vertical" deflection of the beams. Then, in accordance with one bit of the second portion or half of the address, the second digital number sequence is monotonically either incremented or decremented, causing the reference beam to scan a "horizontal" path right or left across a second manifold 29 of fiducial marks spanning the quadrants, at the constant "vertical" level, again giving rise to pulses as each fiducial mark is encountered. The number of such pulses, matched to the numerical significance of the remainder of the second portion of the address, controls gating permitting access to one location or a range of locations on the data storage targets. If, at the end of this sequence of actions, both digital number sequences are returned to their initial states, the reference electron beam is returned to blank area 27. The path traced out is shown by dotted lines in FIG. 3.

Figure 4:
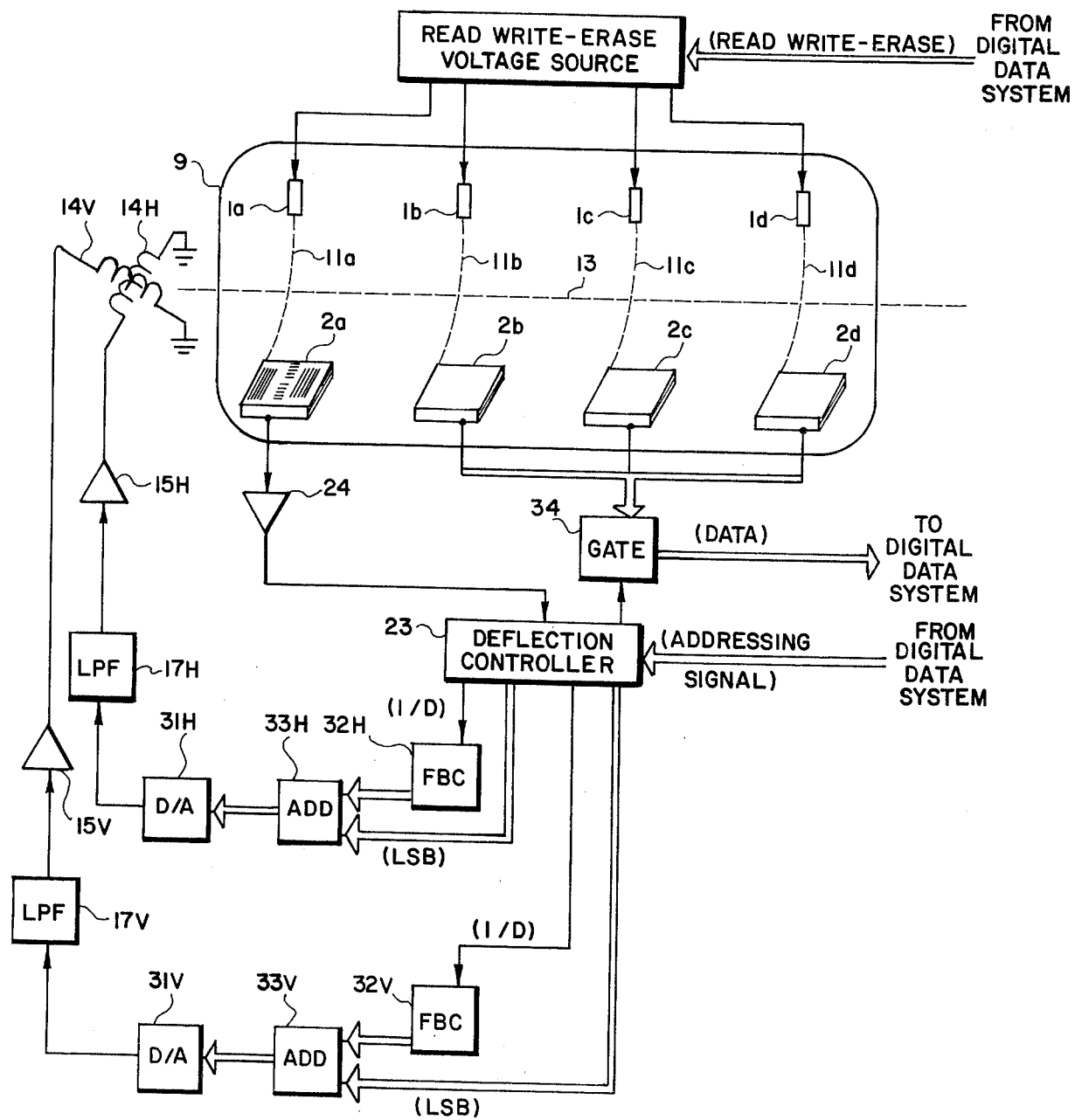
FIG. 4 is a simplified schematic diagram illustrating an alternative procedure for precise location of electron beams upon their target surfaces.

Referring now to FIG. 4, a simplified schematic diagram wherein elements similar to those in the preceding figures are represented by the same numerals, there is illustrated by way of example apparatus whereby the just-described alternate and essentially discrete beam alignment procedure can be performed. FIG. 4 illustrates beam alignment in both of two directions at right angles. Beams 11a–d may therefore be deflected in unison in both directions by magnetic field component 13 which is the vector resultant of the "horizontal" and "vertical" fields produced by currents in, respectively, "horizontal" and "vertical" deflection coils 14H and 14V which are parts of deflection module 10. The deflection currents to these coils may be provided by, respectively, conventional amplifiers 15H and 15V in conformity with analog deflection signals received from respectively, digital-to-analog converters 31H and 31V and smoothed, respectively, by low-pass filters 17H and 17V.

In the initial or quiescent state of the memory device, reference electron beam 11a may fall in a blank area of reference target surface 2a which may resemble the embodiment illustrated in FIG. 3; the other electron beams 11b–d may fall upon corresponding locations upon their target surfaces 2b–d. The address of the data to be accessed is supplied by the associated digital data system to deflection controller 23. In accordance with one bit of a first portion, such as a half, of the aforementioned address, deflection controller 23 starts a first train of increment or decrement pulses to forward-backward counter 32V. For the purpose of the present simplified discussion, parallel digital adder 33V may be omitted, and the increasing or decreasing digital number sequence in counter 32V may be assumed to be supplied directly to digital-to-analog converter 31V which provides a changing deflection current in deflection coil 14V. This in turn provides a changing "vertical" deflection field which deflects the electron beams 11a–d in unison, causing reference electron beam 11a to scan a "vertical" path up or down a first manifold 28 of fiducial marks, as described with reference to FIG. 3.

As reference beam 11a encounters the fiducial marks, the resulting reference target signals are boosted by amplifier 24 and supplied as pulses to deflection controller 23. When the number of such pulses matches the numerical significance of the remaining bits of the first portion of the address, the deflection controller stops the first train of increment or decrement pulses to forward-backward counter 32V. The "vertical" deflection of the beams is thus held constant so that reference beam 11a is aligned with that one, of the first manifold 28 of fiducial marks, which corresponds to the first portion of the aforementioned address.

Then, in accordance with one bit of the second portion of the aforementioned address, deflection controller 23 starts a second train of increment or decrement pulses to forward-backward counter 32H. Again, for the purpose of the present simplified discussion, parallel digital adder 33H may be omitted, and the increasing or decreasing digital number sequence in counter 32H may be assumed to be supplied directly to digital-to-analog converter 31H, which provides a changing deflection current in deflection coil 14H. This in turn provides a changing "horizontal" deflection field which deflects electron beams 11a–d in unison, causing reference electron beam 11a to scan a "horizontal" path right or left across a second manifold 29 of fiducial marks, as described with reference to FIG. 3.

Again, as reference electron beam 11a encounters the fiducial marks, the resulting reference target signals are boosted by amplifier 24 and supplied as pulses to deflection controller 23. When the number of such pulses matches the numerical significance of the remaining bits of the second portion of the address, the deflection controller opens data gate 34 for the duration of one or more pulses, according to the data access protocol of the digital data system, to permit sequential access to one or more successive data bit locations on the several storage target surfaces. Following completion of this sequence of operations, the deflection controller commands return to the initial or quiescent state of the device. The two steps of the foregoing alternate alignment procedure may be commonly described, in the terminology of digital devices, by stating that the algebraic sign, of still another or third difference of values between the number of encounters of the beam with fiducial marks and the number represented by appropriate bits of the address, is converted to a binary switching signal, resulting in alignment of the beam with the data locations to be accessed.

It is not necessary that there be one fiducial mark for each interval of spatial quantization of the data pattern on the target surfaces. Typically, only one fiducial mark may be used for each eight intervals of spatial quantization, and correspondingly the circuit logic is chosen to augment each digital number sequence by an amount corresponding to the least significant three bits of its portion of the address, following matching of the number of fiducial pulses to numerical significance of the remainder of that portion of the address. The above-described augmentation is essentially a process of open-loop vernier positioning of the whole set of beams, as compared with the closed-loop process based on counting of fiducial marks. However, ordinary circuit and device stability is more than adequate to provide the one-part-in-eight vernier positioning accuracy between fiducial marks. Also, the much coarser pattern thus required for the fiducial marks permits full utilization of the high information storage density of associated smooth-layer storage targets, results in a higher production yield of useful reference targets, and provides stronger pulses when the reference beam encounters fiducial marks.

Referring again to FIG. 4, there is illustrated by way of example additional apparatus whereby the just-described vernier positioning of the beams may be performed; this apparatus may include the parallel digital adders 33V and 33H which were omitted in the previous simplified discussion. When performing the vernier positioning function, the deflection controller does not use the two sets of less significant bits, typically three in each set, from each portion of the aforementioned address, in the process of matching the numerical significance of the portions of the address with the number of pulses signifying encounters between reference electron beam 11a and the fiducial marks. Instead, the two sets of less significant bits are reserved and just the more significant bits of those portions of the address, less the single bits used to denote incrementing or decrementing, supply the numerical significance utilized in the matching process. Upon occurrence of such numerical matches, the deflection controller applies the two sets of reserved less significant bits as deflection vernier offset signals to their respective parallel digital adders, where they are added to the digital number contents of the respective forward-backward counters. Such addition constitutes a vernier adjustment of those contents with consequent deflection vernier offset positioning of the electron beams upon their respective targets. It will be noted that this additive digital process yields a "backwards" vernier offset to the digital number content of a decremented counter, but this is immaterial, since the assignment of target locations is unique. Alternatively, the parallel digital adders can be replaced by adder-subtractors, with the sign of the operations commanded by the increment-decrement bits.

Some savings in equipment, at the expense of a small additional amount of accessing time, can be achieved by use of an alternative scheme for performing the described vernier positioning of the beams. According to this alternative scheme, the parallel digital adders 33V and 33H are not used. The two sets of less significant bits are decoded and utilized as delay numbers in such a way as to delay the switching operations, which follow matching of numbers of encounter pulses with the numerical significance of address portions, by a number of sequence steps corresponding to the numerical significance of the less significant bits. Typically, this kind of operation can be performed by setting the less significant bits into down-counters, which are counted down to zero by the sequence pulses to yield the binary switching signals, following the matching operation which yielded the binary control signal. For a device having three-bit vernier positioning and ten-bit spatial quantization, three-bit down-counters could thus replace ten-bit adders, at the expense of up to six sequence pulse periods of delay, compared to the one-pulse-period addition scheme.

In still another alternative scheme not requiring parallel adders, the two sets of less significant bits are decoded by digital-to-analog conversions and are additively combined with the analog deflection signals from digital-to-analog converters 31H and 31V.

The foregoing description has been in terms of a very simple device, in the interest of clarity of exposition of the invention. For example, a practical embodiment of this invention is somewhat more complex. Instead of merely four beam-target modules, a typical practical device (comprising evacuated envelope 9 and focus-deflection module 10) may have as many as 25 (or more) such modules, 16 of which may be used for reading and writing 16-bit parallel digital data words, 4 more may be used for error detecting and correcting bits for the data words, 1 may be the reference module, 1 more may be a spare reference module, and the remaining 3 may be spare data modules. Typically, present-day smooth-layer data target surfaces have an active area of slightly more than 5 mm × 5 mm, and comprise a high-resistance boron-doped p silicon substrate bearing a 1 ohm-cm arsenic-doped n silicon epitaxial layer about 1.5 $\mu$m thick, which in turn bears a silicon dioxide layer about 0.4 $\mu$m thick covered with a thin aluminum coating of about 0.1 $\mu$m thickness. Using a 10 kilovolt electron beam having a 2.5 $\mu$m focused beam size, one obtains data bit sizes having a 5.0 $\mu$m subtense, or about 1024 data bits across the active area of a target surface. Accordingly, each target surface can store about 1,000,000 data bits; this yields a device capacity of about 1,000,000 16-bit words for the typical practical device.

The reference target may be made by suitable marking of a smooth-layer data storage target. For the storage structure described, using the usual photoresist-and-etch process, etching fiducial marks almost all the way through the n-silicon epitaxial layer results in a target which gives strong signals when the beam encounters the marks, and with sharp signal transitions at the edges, as required for accurate location.

For magnetically focusing the electron beams, a field of 150 Gauss is typical for a linearly distributed accelerating field and the usual electron gun voltages. For the cited beam size, this field should be held to $\pm$ 0.3 Gauss to assure proper focus. A simple air-core coil with end windings, of 17 cm outside diameter and 20 cm length, readily supplies such uniformity throughout a working volume of 5 cm diameter and 10 cm length. The deflection field requirements are modest: about $\pm$ 6 Gauss over a 10 cm deflection length; the necessary coils can be integrated with the air-core focus coil. Such a structure will suffice for most purposes. Where economy of power is desired, the larger part of the focusing field can be supplied by a permanent magnet structure, and the provision of soft ferrite magnetic yoke components can greatly reduce deflection drive power requirements.

The electron guns may be similar to small long-life "Vidicon" guns, with the exception of the first-anode aperture, which may be only 2.5 $\mu$m in diameter, and located a trifle farther from the gun cathode. With a cathode current density greater than 0.1 Amp/cm$^2$, this yields the necessary $10^{-7}$ Coulomb/cm$^2$ beam density required for data transfer rates of over $10^6$ bits per second at each target surface, at 10 kilovolts beam landing energy. These are the requirements for writing or erasing; reading may be acomplished with a lower beam current. It should be noted that, for a given total data rate, the present invention allows use of lower emission-density individual emitters, through parallel operation of the plurality of beam-target modules, each of which therefore needs to process only a fraction of the total data rate.

The embodiments described have utilized both magnetic focusing and magnetic deflection. As well-known to those skilled in the art, either or both of these functions may, if desired, be performed by suitable electrostatic fields. For electrostatic focusing, each electron gun would require an additional cylindrical electrode at a potential of the order of that of the target surfaces. This has the disadvantage of adding bulk to the assembly and would require larger deflection fields. Electrostatic deflection may also be accomplished, at some cost in terms of bulk and difficulty. While it may provide faster access to randomly-selected addresses, it would result in a coarser beam with consequent loss in data packing density. In the most probable application for a device of this sort, as bulk data storage backing up a fast random-access main memory, the customary mode of operation is to transfer all or a large fraction of a whole line of data as a "page" in a serial transfer of multibit words with main memory. In this mode, a simple line scan is sufficient, and the random-access capability of electrostatic deflection is not needed.

It is preferred to quantize deflection commands to a precision which is two binary bits, or four times, as fine as the subtense of a single data address. This assures that the quantization alignment error between beam and data is sufficiently low. Also, it is preferred to perform data access sweeps in a given data block consistently in the same direction, in order to avoid alignment errors due to magnetic hysteresis and time lags. Since data transfer usually occurs with a constant value of deflection in a first direction, as contrasted with the varying value when alignment is accomplished in that direction, it is preferred to delay the data transfer sweep in the second direction briefly until the constant first deflection has settled down.

The present invention may be used in the storage and retrieval of binary-coded digital data. However, the basic principle of electron-beam-accessed stored-charge memory is suitable for storage of multi-level data, and therefore the present invention may be used for digital data coded in ternary or higher-radix code, or for exampled analog data such as image samples.

In the embodiment shown in FIG. 1, all of the beam-target modules are enclosed in a common evacuated envelope. However, it is to be understood that the structure can also be configured as a bundle of slim evacuated envelopes, each containing its own electron gun and target surface, with the whole bundle enclosed in a common deflection module. Such a configuration is advantageous for production purposes, since one can discard faulty single-target modules and assemble only the good ones into memories. Also, a wide range of memory capacities can be attained by assembling different sizes of bundles. On the other hand, the repetition of envelopes, supports and headers will result in a more bulky assembly and difficulty is to be expected in assembling the bundles of modules in a satisfactorily rigid manner.

The reference beam-target module has been shown and described as completely separate from any other module. However, it is to be further understood that its function may, for example, be merged with that of a data storage module, in a device using the first-described beam alignment procedure, by placing the fiducial marks outside the target storage surface area which is utilized for data storage. For example, if the fiducial marks are constructed as marks at the outside corners of the target surface, it is possible to perform alignment scans without allowing the beam to impinge upon the target locations which contain data. However, such a fiducial mark pattern is not as effective for compensation of second-order scan errors such a nonlinearity or curvature of scan. Also, the area inside the fiducial marks of such a reference target can be used for various purposes, such as storage of short sequences of readwrite data, or as a read-only memory for data permanently written during manufacture of the reference target.

The two procedures described with reference to FIG. 2 and FIGS. 3 and 4 are not mutually exclusive; it is readily possible to utilize one of the procedures for precise beam alignment in one direction, and the other procedure for precise beam alignment in the other direction. Such a hybrid arrangement might be preferable in applications where whole lines of data are accessed each time. In such an application, the first-described procedure would be used for continuous maintenance of alignment along the lines, and the second-described procedure used to call up the line to be accessed.

The embodiments of this invention have been described in terms of particular combinations of analog or continuous, and digital or discrete, operations. However, as is well-known to those skilled in the at, it is readily possible to interchange analog and digital operations in carrying out a procedure or process. For example, in the embodiment illustrated in FIG. 2, the functions of forward-backward counter 25 and digital-to-analog converter 19 could be performed by an analog pulse integrator circuit, at the cost of somewhat greater drift. Further, it is well-known that many such operations are logically linear, and in that sense are commutative and can be performed in various sequential orders.

There have been described, with respect to the enclosed drawings, apparatus for and methods of combining precise and reliable data access with high information storage density, in an electron-beam-accessed memory for electrical data. Using an array of beam-target modules in a common deflection field, there has been shown how, by adjustment of that field so that the electron beam of a reference beam-target module performs a scan over fixed reference locations on its target surface in conformity with predetermined commands, the electron beams of the other beam-target modules will precisely and reliably access data locations on their target surfaces.

The various features and advantages of the invention are thought to be clear from the foregoing description. Various other features and advantages not specifically enumerated will undoubtedly occur to those versed in the art, as likewise will many variations and modifications of the preferred embodiment illustrated, all of which may be achieved without departing from the spirit and scope of the invention as defined by the following claims.

We claim:

1. In a vacuum-tube device for storage of electrical data as patterns of charge stored at addressed locations upon an insulating target and accessed by electron beam means deflected to said addressed locations in a vacuum in correspondence with an addressing signal comprising a plurality of values, the combination comprising:
    (a) a plurality of beam-target modules, each said beam-target module comprising an electron beam source and a facing target surface, each said electron beam source projecting an electron beam upon its respective facing target module;
    (b) electron beam deflection means for providing a common deflection field for deflecting said electron beams, all of said electron beams being disposed within said deflection field and being commonly deflected thereby;
    (c) first circuit means for applying a deflection signal to said electron beam deflection means for providing said common deflection field deflecting in unison the electron beams of said beam-target modules;
    (d) electron-beam-sensitive reference points upon the target surface of one of said beam-target modules, said one of said beam-target modules being at least in part a reference beam-target module having a reference electron beam and a reference target surface;
    (e) second circuit means coupled to said reference target surface for providing an output signal when the impingement of said reference beam upon said reference target surface falls upon any one of said reference points;
    (f) third circuit means for receiving the output signal of said second circuit means and comparing it with said addressing signal and providing at least one control output signal representing the spatial difference between impingement of said reference beam and the location upon said reference target surface corresponding to a predetermined value of said addressing signal;
    (g) fourth circuit means for receiving the control output signal of said third means and the deflection signal of said first circuit means to control said first circuit means to reduce said spatial difference;
    (h) fifth circuit means for coupling at least one of said plurality of beam-target modules to a system utilizing electrical data; and
    (i) sixth circuit means for control of potentials of said beam-target modules to accomplish writing, reading and erasing of electrical data.

2. A vacuum tube device as in claim 1 wherein said first circuit means deflection signal is derived from a sequence of values spanning a set of values of said addressing signal and said reference points comprise at least one pair of reference points at predetermined locations spanning a spatial interval upon said reference target surface.

3. A vacuum tube device as in claim 2 and additionally including:
    (a) means for comparing the value of the addressing signal corresponding to the predetermined location of one of said pair of reference points and the value of the addressing signal simultaneous with the occurrence of an encounter of said reference electron beam and said one of said pair of reference points and deriving a second control output signal from said comparison; and
    (b) means for additively combining said second control output signal with said deflection signal to reduce the difference of the compared values from which said second control output signal is derived, said difference being a first difference of values.

4. A vacuum tube device as in claim 3 and additionally including:
    (a) further means for comparing the value of the addressing signal corresponding to the predetermined location of the other of said pair of reference points and the value of the addressing signal simultaneous with the occurrence of an encounter of said reference electron beam and said other of said pair of reference points and providing a third control output signal from said comparison; and
    (b) means for multiplicatively combining said third control output signal with said deflection signal to reduce the difference of the compared values from which said third control output signal is derived, said difference being a second difference of values.

5. A vacuum tube device as in claim 4 wherein the algebraic sign of the said first difference of values changes the magnitude of said second control output signal and the algebraic sign of the second difference of values changes the magnitude of said third control output signal.

6. A vacuum tube device as in claim 1 wherein said deflection signal is derived from at least one monotonic sequence of values within a set of values of said addressing signal, and said reference points comprise at least one manifold of lines.

7. A vacuum tube device as in claim 6 and additionally including:
    (a) means for comparing the number of encounters of said reference electron beam with lines of said manifold of lines and the numerical value of a portion of said addressing signal, and yielding a third difference of values, the algebraic sign of which comprises a binary control signal;
    (b) means for converting said binary control signal to a binary switching signal; and
    (c) means for combining said switching signal with said deflection signal to reduce said spatial difference between the point of impingement of said reference beam and the location upon said reference target surface corresponding to a predetermined value of said addressing signal.

8. A vacuum tube device in accordance with claim 6 and additionally including:
    (a) means for comparing the number of encounters of said reference electron beam with lines of said manifold of lines and the numerical value of only more significant bits of a portion of said addressing signal, and yielding a third difference of values, the algebraic sign of which comprises a binary control signal;
    (b) means for converting said binary control signal to a binary switching signal;
    (c) means for combining said switching signal with said deflection signal to reduce said spatial difference between the point of impingement of said reference beam and the location upon said reference target surface corresponding to a predetermined value of said addressing signal;
    (d) means for reserving the less significant bits of said portion of said addressing signal;
    (e) means for receiving said reserved less significant bits as a deflection vernier offset signal;

(f) switching means for selecting said deflection vernier offset signal in accordance with said binary switching signal; and (g) means for combining said selected deflection vernier offset signal with said deflection signal to reduce further said spatial difference.

9. A vacuum tube device as in claim 8 wherein:
(a) said deflection vernier offset signal is received in digital form;
(b) said deflection signal is provided in digital form; and
(c) said deflection vernier offset signal and said deflection signal are additively combined.

10. A vacuum tube device as in claim 8 wherein:
(a) said deflection vernier offset signal is received in analog form;
(b) said deflection signal is provided in analog form; and
(c) said deflection vernier offset signal and said deflection signal are additively combined.

11. A vacuum tube device in accordance with claim 8 wherein:
(a) said deflection vernier offset signal is received as a delay number; and
(b) said means for converting said binary control signal to said binary switching signal delays said binary switching signal with respect to said binary control signal by a number of steps, in said monotonic sequence, equal to said delay number.

12. In an electron beam accessed semiconductor memory, the method of accessing addressed locations in correspondence with an addressing signal comprising the steps of:
(a) providing a plurality of semiconductor targets including a reference target, at least some of said targets being adapted for storage of electrical data as patterns of charge at addressed locations upon said targets;
(b) directing a separate electron beam toward each one of said targets, said electron beams including a reference electron beam directed toward said reference target;
(c) providing electron-beam-sensitive reference points upon at least a portion of the surface of said reference target;
(d) providing an output signal when the impingement of the reference electron beam falls upon any one of said reference points on said reference target;
(e) comparing said output signal with the addressing signal and providing at least one control output signal representing the spatial difference between the location of the impingement of the reference electron beam and the location upon said reference target corresponding to a predetermined value of said addressing signal; and
(f) commonly deflecting all of said electron beams in accordance with said control output signal to reduce said spatial difference.

13. The method according to claim 12 wherein at least some of said targets are coupled to a system utilizing electrical data and the potentials and currents of the electron beams impinging on those targets are controlled to accomplish reading of electrical data.

14. The method according to claim 13 wherein the potentials and currents of the electron beams are controlled to accomplish writing of electrical data.

15. The method according to claim 14 wherein the potentials and currents of the electron beams are controlled to accomplish erasing of electrical data.

16. The method according to claim 12 wherein a deflection field is provided by a deflection signal for commonly deflecting all of said electron beams and said deflection signal is derived from a sequence of values spanning a set of values of said addressing signal.

17. The method according to claim 16 wherein said reference points comprise at least one pair of reference points at predetermined locations spanning a spatial interval upon said reference target and said deflection signal and said control output signal are combined to effect said deflecting of said electron beams.

18. The method according to claim 17 wherein:
(a) the value of the addressing signal corresponding to the predetermined location of one of said pair of reference points is compared with the value of the addressing signal simultaneous with the occurrence of an encounter of the reference electron beam and said one of said pair of reference points, and a second control output signal is derived from said comparison; and
(b) said second control output signal is combined with said deflection signal to reduce the difference of the compared values from which said second control output signal is derived, said difference being a first difference of values.

19. The method according to claim 18 wherein:
(a) the value of the addressing signal corresponding to the predetermined location of the other of said pair of reference points is compared with the value of the addressing signal simultaneous with the occurrence of an encounter of said reference electron beam and said other of said pair of reference points and provide a third control output signal derived from said comparison; and
(b) said third control output signal is combined with said deflection signal to reduce the difference of the compared values from which said third control output signal is derived, said difference being a second difference of values.

20. The method according to claim 19 wherein the algebraic sign of the first difference of values is used to change the magnitude of said second control output signal and the algebraic sign of the aforesaid second difference of values is used to change the magnitude of said third control output signal.

21. The method according to claim 12 wherein a deflection field is provided by a deflection signal for commonly deflecting all of said electron beams and said deflection signal is derived from at least one monotonic sequence of values within the range of values of said addressing signal, and said reference points are arranged to comprise at least one manifold of lines.

22. The method according to claim 21 wherein:
(a) the number of encounters of said reference electron beam with lines of said manifold of lines is compared with the numerical value of a portion of said addressing signal to yield a third difference of values, the algebraic sign of which comprises a binary control signal;
(b) converting said binary control signal to a binary switching signal; and
(c) combining said binary switching signal with said deflection signal to reduce said spatial difference between the location of the impingement of said reference beam and the location upon said reference target surface corresponding to a predetermined value of said addressing signal.

23. The method according to claim 22 wherein:
(a) said comparison of said number of encounters with said numerical value utilizes only more significant bits of said portion of said addressing signal;
(b) the less significant bits of said portion of said addressing signal are reserved as a deflection vernier offset signal;
(c) said deflection vernier offset signal is switchably selectable in accordance with said binary switching signal; and
(d) when selected, said deflection vernier offset signal is combined with said deflection signal to reduce further said spatial difference.

24. The method according to claim 23 wherein:
(a) said deflection vernier offset signal is in digital form;
(b) said deflection signal is in digital form; and
(c) said deflection vernier offset signal and said deflection signal are additively combined.

25. The method according to claim 23 wherein:
(a) said deflection vernier offset signal is in analog form;
(b) said deflection signal is in analog form; and
(c) said deflection vernier offset signal and said deflection signal are additively combined.

26. The method according to claim 23 wherein:
(a) said deflection vernier offset signal is provided as a delay number; and
(b) said binary control signal is converted to said binary switching signal delayed with respect to said binary control signal by a number of steps, in said monotonic sequence, equal to said delay number.

* * * * *